(12) United States Patent
Gilleo et al.

(10) Patent No.: US 6,228,678 B1
(45) Date of Patent: May 8, 2001

(54) FLIP CHIP WITH INTEGRATED MASK AND UNDERFILL

(75) Inventors: Kenneth Burton Gilleo, Cranston, RI (US); David Blumel, New York, NY (US)

(73) Assignee: Fry's Metals, Inc., Jersey City, NJ (US)

( * ) Notice: Subject to any disclaimer, the term of this patent is extended or adjusted under 35 U.S.C. 154(b) by 0 days.

(21) Appl. No.: 09/266,166

(22) Filed: Mar. 10, 1999

Related U.S. Application Data

(63) Continuation-in-part of application No. 09/067,381, filed on Apr. 27, 1998.

(51) Int. Cl.[7] ............................. H01L 21/44; H01L 21/48; H01L 21/50
(52) U.S. Cl. ..................... 438/108; 438/612; 438/613; 438/614; 228/180.21; 228/180.22
(58) Field of Search ........................... 438/108, 612–614; 228/180.21, 180.22

(56) References Cited

U.S. PATENT DOCUMENTS

| 5,128,746 | 7/1992 | Pennisti . | |
|---|---|---|---|
| 5,493,075 | * 2/1996 | Chong et al. | 174/261 |
| 6,046,071 | * 4/2000 | Sawai et al. | 438/106 |

FOREIGN PATENT DOCUMENTS

WO 99/04430  1/1999  (WO) .

* cited by examiner

Primary Examiner—John F. Niebling
Assistant Examiner—David A Zarneke
(74) Attorney, Agent, or Firm—Mintz, Levin, Cohn, Ferris, Glovsky and Popeo, P.C.

(57) ABSTRACT

A flip chip having solder bumps, an integrated underfill, and a separate flux coating, as well as methods for making such a device, is described. The device is characterized in that the underfill material is provided on the chip surface prior to the application of solder bumps, and then treated to form apertures therein which act as a mask for solder bump application. The resulting device is well suited for a simple one-step application to a printed circuit board, thereby simplifying flip chip manufacturing processes which heretofore have required a separate underfilling step.

15 Claims, 1 Drawing Sheet

FLIP CHIP WITH INTEGRATED MASK AND UNDERFILL

RELATED APPLICATIONS

This application is a continuation-in-part of copending application U.S. Ser. No. 09/067,381 filed Apr. 27, 1998, and entitled Flip Chip With Integrated Flux and Underfill.

FIELD OF THE INVENTION

The present invention relates to a novel flip chip design. More particularly, the present invention relates to a flip chip which incorporates solder bumps, flux and an underfill material, wherein the underfill material acts as a mask during application of the solder bumps.

BACKGROUND OF THE INVENTION

In the electronics industry, electrical components such as resisters, capacitors, inductors, transistors, integrated circuits, chip carriers and the like are typically mounted on circuit boards in one of two ways. In the first way, the components are mounted on one side of the board and leads from the components extend through holes in the board and are soldered on the opposite side of the board. In the second way, the components are soldered to the same side of the board upon which they are mounted. These latter devices are said to be "surface-mounted."

Surface mounting of electronic components is a desirable technique in that it may be used to fabricate very small circuit structures and in that it lends itself well to process automation. One family of surface-mounted devices, referred to as "flip chips", comprises integrated circuit devices having numerous connecting leads attached to pads mounted on the underside of the device. In connection with the use of flip chips, either the circuit board or the chip is provided with small bumps or balls of solder (hereafter "bumps" or "solder bumps") positioned in locations which correspond to the pads on the underside of each chip and on the surface of the circuit board. The chip is mounted by (a) placing it in contact with the board such that the solder bumps become sandwiched between the pads on the board and the corresponding pads on the chip; (b) heating the assembly to a point at which the solder is caused to reflow (i.e., melt); and (c) cooling the assembly. Upon cooling, the solder hardens, thereby mounting the flip chip to the board's surface. Tolerances in devices using flip chip technology are critical, as the spacing between individual devices as well as the spacing between the chip and the board is typically very small. For example, spacing of such chips from the surface of the board is typically in the range of 0.5–3.0 mil and is expected to approach micron spacing in the near future.

One problem associated with flip chip technology is that the chips, the solder and the material forming the circuit board often have significantly different coefficients of thermal expansion. As a result, differing expansions as the assembly heats during use can cause severe stresses, i.e., thermomechanical fatigue, at the chip connections and can lead to failures which degrade device performance or incapacitate the device entirely.

In order to minimize thermomechanical fatigue resulting from different thermal expansions, thermoset epoxies have been used. Specifically, these epoxies are used as an underfill material which surrounds the periphery of the flip chip and occupies the space beneath the chip between the underside of the chip and the board which is not occupied by solder. Such epoxy systems provide a level of protection by forming a physical barrier which resists or reduces different expansions among the components of the device.

Improved underfill materials have been developed in which the epoxy thermoset material is provided with a silica powder filler. By varying the amount of filler material, it is possible to cause the coefficient of thermal expansion of the filled epoxy thermoset to match that of the solder. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

While underfill has solved the thermal mismatch problem for flip chips on printed circuit boards, it has created significant difficulties in the manufacturing process. For example, the underfill must be applied off-line using special equipment. Typically, the underfill is applied to up to three edges of the assembled flip chip and allowed to flow all the way under the chip. Once the material has flowed to opposite edges and all air has been displaced from under the chip, additional underfill is dispensed to the outer edges so as to form a fillet making all four edges symmetrical. This improves reliability and appearance. Next, the assembly is baked in an oven to harden the underfill. This process, which may take up to several hours, is necessary to harden and fully cure the underfill. Thus, although the underfill solves the thermal mismatch problem and provides a commercially viable solution, a simpler manufacturing method would be desirable.

Recently, attempts have been made to improve and streamline the underfill process. One method that has shown some commercial potential involves dispensing underfill before assembling the flip chip to the board. This method requires that the underfill allow solder joint formation to occur. Soldering of flip chips to printed circuit boards is generally accomplished by applying flux to the solder bumps on the flip chip or to the circuit pads on the printed circuit board. Thus, it has been suggested to use an underfill that is dispensed first, prior to making solder connections. In order to facilitate solder bonding, however, the underfill must contain flux or have inherent properties that facilitate solder joint formation. Flux is used since the pads on printed circuit boards often oxidize, and since solder bumps on flip chips are always oxidized. Thus, the flux is designed to remove the oxide layers facilitating solder joint formation.

Certain underfills commonly called "dispense first underfills" have been designed with self-contained flux chemistry. Unfortunately, the properties required for a good flux and those required for a good underfill are not totally compatible. As such, a compromise of properties results. The best flux/underfill materials typically require more than an hour to harden. Additionally, flux-containing underfills still require the use of special equipment including robot dispensing machines. Also, since solder assembly and underfill application are combined into a single step, the flip chip cannot be tested until the assembly is complete. Thus, if the chip does not operate satisfactorily, it cannot be removed because the underfill will have hardened, thereby preventing reworking.

Finally, certain problems have been found to arise when applying flux/underfill materials to bumped surfaces of flip chips. The problems result because the rough surface geometry of the bumped surface is not readily amenable to the application of fluids, particularly those having high viscosity. Thus, Providing the flux/underfill directly onto a bumped surface raises at least the possibility of discontinuities and air bubbles forming during the flux/underfill application process. Furthermore, by eliminating bumping prior to application of the flux/underfill layer, it may be possible to eliminate process steps, thereby streamlining the manufacturing process while providing chip makers with greater design and manufacturing flexibility.

In view of the above, a need still exists for a more efficient process that reduces the need for expensive equipment and that is compatible with existing electronic device assembly lines. A need for a reworkable underfill also exists. A further need exists for a flux/underfill material that can act as a mask during the bumping steps as well.

SUMMARY OF THE INVENTION

The present invention relates to an integrated circuit assembly comprising a semiconductor wafer which includes solder bumps, flux, and an underfill material. In a broad sense, the invention relates to an integrated circuit assembly which includes a substrate having a plurality of solderable contact sites on one surface and a plurality of solder bumps positioned on that surface such that each of the solderable contact sites has one solder bump associated with and affixed to each solderable contact site. Each site further includes a flux material which covers at least a portion of each solder bump and an underfill material which occupies the space defined between each of the solder bumps. The underfill material is of a depth such that at least a flux covered portion of each solder bump extends above the underfill. In the present case, the underfill material is applied to the wafer prior to applying the solder bumps. The underfill can then be processed to convert it into a mask to assist in placement of the bumps onto the wafer surface.

The present invention also relates to a method for making an integrated circuit assembly which includes the steps of providing a substrate having a plurality of solderable contact sites on a surface thereof. An underfill material is applied to the surface of the substrate. Subsequently, the underfill is treated to form gaps therein at each of the solderable contact sites. The resulting underfill mask simplifies application of the solder bumps to the wafer in a manner such that each of the solderable contact sites has one solder bump associated with it. Each solder bump is then mounted to its associated contact site. Once the solder bumps are mounted, a flux material is applied to the solder bumps in a manner such that at least a portion of each solder bump is provided with flux. The resulting wafer is characterized in that the underfill occupies the space defined between each of the solder bumps and has a depth such that at least a flux covered portion of each solder bump extends through the underfill.

Lastly, the invention relates to a process for affixing a flip chip to a circuit board. The method involves providing a printed circuit board having a plurality of solderable contact sites on a surface, providing an integrated circuit chip of the type described above (i.e., a chip having solder bumps, flux and an underfill material present on its surface), and positioning the integrated circuit chip relative to the printed circuit board such that each solder bump is in contact with a solderable contact site on the printed circuit board. Once positioned, the integrated circuit chip assembly is heated to a temperature sufficiently high to melt the solder and the underfill material. Subsequently, the assembly is allowed to cool to a temperature which allows the solder and underfill material to solidify.

DETAILED DESCRIPTION OF THE INVENTION

Figure 1:
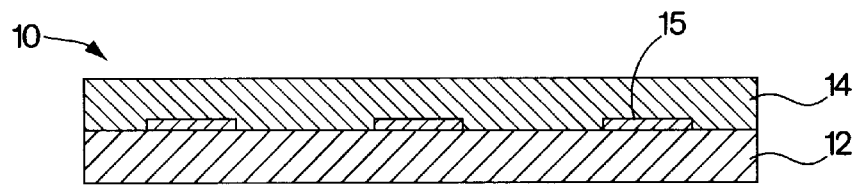
FIG. 1 is a schematic depiction of one embodiment of the invention in which a wafer has an underfill material formed thereon prior to application of solder bumps.

The present method provides a unique method of applying an underfill to a flip chip wafer. In particular, in the present invention, a coatable underfill material, (typically a composite of a dissolved polymer and a solid filler in a solvent) is applied to the wafer surface prior to application of any solder bumps. It is important that the material selected for application has properties suitable for use as a flip chip underfill, or at the very least, can develop such properties during reflow solder assembly processing. The preferred material is a thermoplastic, such as Staystik™, commercially available from Alpha Metals, Inc. This material is then modified with a predetermined amount of an appropriate filler to provide the underfill with a coefficient of thermal expansion (CTE) that approximates that of the solder joints which will be formed by the bumps. A mineral filler such as silicon dioxide is preferred. The preferred CTE of the resulting underfill material is approximately 25 ppm/° C., although values of up to about 45 ppm/° C. are also envisioned. Even after processing the CTE of the underfill cannot become greater than about 60 ppm/° C., because this can cause detrimental thermomechanical stresses at the solder joints.

The preferred filler material is spherical and has a diameter less than the high of the solder bumps that will be applied to the wafer. Thus, as typical filler ranges in size from about 3 microns to about 15 microns. While silicon dioxide is preferred because of its ready availability, other non-electrically conductive materials such as aluminum nitride, aluminum oxide and beryllium oxide can be use as well.

A solvent, or solvent blend, which is compatible with each of the components is selected. Among the suitable solvents are included many common oxygenated, nitrogen-containing solvents as well as many polar aromatic solvents. The particular solvent system chosen should have evaporation and boiling points that allow removal of the solvent in the environment of a drying oven once the wafer is coated with the underfill material. Suitable solvents can be found in the Staystik pastes available from Alpha Metals, Inc.

In use, the underfill material is applied directly to the face, or active, side of the wafer prior to bumping. Semiconductor wafers typically have access, or bonding, pads formed of aluminum. Such pads are typically made solderable prior to bumping and, in this case, prior to applying the underfill material. The access pads are rendered solderable by depositing a solderable finish, often referred to as under bump metallization (UBM). Several UBM processes are commercially available, as are third-party UBM services provided by vendors. In the UBM process, the solderable finish is usually applied to the aluminum access pads using either vacuum deposition or chemical plating.

The underfill solution can be formulated to have the correct rheology for application to the wafer using any of a number of methods. For example, since the ratio of solvent to solids in the solution determines the viscosity of the solution, it is possible to formulate underfill solutions that can be applied using different methods. Since the solvent is substantially entirely evaporated after application of the underfill solution to the wafer, the resulting, solid underfill layer can have the composition regardless of the initial viscosity and percent solids of the underfill solution. This results because the solvent acts simply as a vehicle for carrying the solids during underfill application.

In one method, the underfill solution can be applied by spin coating, a common semiconductor processing method in which liquid is deposited onto a spinning wafer in order to provide a smooth and level coating. An underfill having a viscosity in the range of about 80–85 Kcps, measured at 2.5 RPM using an RVT #6 spindle on a Brookfield viscometer, has been found to give good results. When applied to a wafer, a wafer spin rate of about 1200 RPM yields a smooth coating.

A second method is stencil printing. This method requires a more viscous material that is produced using less solvent. The thixotropic index, (i.e., change in viscosity as a result of mechanical shearing), can also be adjusted, using thixotropic additives, to improve printing characteristics. The thickness of the stencil determines the amount of material applied to the wafer. Likewise, the amount of solvent contained in the underfill solution determines the amount of thickness reduction that occurs in the underfill during drying and solvent evacuation. Thus, it is necessary to consider both the stencil thickness and the solvent percent of the underfill solution in order to precisely control the thickness of the applied underfill. A dry underfill thickness range of about 25 to about 125 microns is suitable and will depend on the height of the bumps to be produced at a later stage. The thickness of the underfill layer is selected to preferably be from about 50 to about 80% of the bump height to allow form the bumps to collapse during the solder reflow step.

It should be understood that while spin coating and stencil printing are preferred, many other methods can be used to apply the underfill to the layer. These include, but are not limited to, needle deposition, spraying, screen printing and others.

The coating is then dried by heating it in an oven or by direct heating of the wafer. It has been found to be advantageous to heat the wafer while simultaneously using a forced hot air oven to help drive solvent out of the coating. Combined top and bottom heating can eliminate any tendency to trap solvent in the underfill layer by a process known as "skinning" in which the surface of the underfill material dries prematurely and forms a film (i.e., a skin) that acts as a barrier to further solvent evacuation. If drying is carried out properly, the resulting underfill material is non-tacky and amenable to handling.

Alternatively, the coating composition can be cast onto a release paper and then dried into a film. The film can be cut into a proper shape, called a preform, and applied to the wafer. Heating, with the application of pressure, will cause the underfill layer to bond to the wafer. In order to apply the solder bumps to the underfill-coated wafer, openings must be formed in the underfill film at each interconnect pad location. In one preferred embodiment, the openings are formed using laser machining techniques. Excimer lasers, for example, can be used to create openings in polymeric films by a photoablation process in which ultra-violet radiation causes the long-chain polymers to break down into small volatile by-products. Patterning can be achieved using either a pattern mask or a directed beam. Optical defraction grating patterning methods are also available. Photoablation is particularly suitable for the present application because it occurs with only a minimum amount of heating and does not damage the wafers. The process parameters can be set so that machining stops when the metal layer below the underfill is exposed, thereby making the process self-limiting. This is not always necessary, however, since many metals are resistant to laser ablation. Although UV lasers are preferred, other lasers, such as infrared (IR) lasers can be used as well.

Bumps of a suitable solder alloy are next applied to the wafer using the underfill as a mask which exposes only those section of the wafer which are to have solder bumps applied, i.e., the exposed pad areas of the wafer. Any bumping methods that do not require mask removal may be employed. In one embodiment, electroless plating can be used. Although the method does not typically require a mask, a high aspect ratio of plated material can be provided using the mask, and in the case of solder bumps, such high aspect ratios are desirable. In cases in which a zincate-electroless nickel process is employed, under bump metallization (described above) can be eliminated since the zincate treatment makes the aluminum platable by nickel.

Bumps made only from solder may be made by starting with solder pastes that are widely available. Stenciling, screen printing, pin transfer and other methods can also apply solder paste. Once the paste has been applied, the bump is formed by melting (i.e., reflowing) the paste. It is necessary to control the conditions at this point, however, because the underfill can soften or even liquefy into a viscous state if it is heated too much during the solder reflow process.

Other solder bumping methods include metal fluid jetting, or inverting the wafer and passing it over a solder wave or fountain of molten solder.

Flux is deposited onto the protruding solder bumps since it is not required on the face of the die. Since the solder bumps protrude above the surface of the underfill material, a number of methods can be used. For example, a thin layer of liquid flux can be coated onto a flat plat of glass. The wafer is then placed, bumps down, onto the thin film of flux and then withdrawn. A thin coating of flux, which can be subsequently dried, will remain on the bumps. Other methods such as roller coating, screen printing and tamp printing can be used as well.

At this stage, the wafer is ready to be diced, or simulated, to produce individual flip chips. Any of a wide variety of the methods known in the art for dicing wafers can be employed to that end. The sole requirement of the inventive wafers is that the process be such that it does not interfere with the underfill material applied to the wafer/chip surfaces.

Once diced, individual flip chips may now be bonded to circuit boards and the like. The flip chip is placed and aligned to the bond pads of a substrate. As used herein, the term "substrate" is intended to mean a circuit board, a chip carrier, another semiconductor device or a metal lead frame. It is not necessary to add flux, although flux may be added for special reasons such as compensating for excessive oxide on substrate pads, or the need to hold the flip chip in place during assembly.

The positioned chip is then run through a solder reflow line commonly used for assembly. A multi-zone oven, with individual heat controls that permit a heating profile is preferred. The flux melts at a temperature ranging from about 80° C. to about 140° C. The melting point is determined by selecting fluxes having epoxy resins with the appropriate melting point. Flux composition will be described in greater detail below. At higher temperatures, the underfill softens and may also melt depending upon the resin selected. Like the fluxes, underfill composition will be described in greater detail below. The solder bumps finally melt and form metallurgical joints to the substrate.

Alternatively, a standard flip chip bonder that can apply heat and pressure can be employed instead of the reflow oven. In that embodiment, the flip chip coated with the flux and underfill is placed into contact with the conductive pads on the circuit board and heat from the bonder head will activate the flux, form joints by reflowing the solder bumps, and cause the underfill and flux system to bond tightly to the board. The use of a standard flip chip bonder would allow a flip chip to be assembled to a board that already contained mounted components. This method could also be used to assemble a chip at a site that is being reworked.

Reworking is desirable in situations in which a chip mounting step has failed to properly position the chip on the board. Specifically, the assembly of fine pitch, high-density components can result in misalignments and failed connections. Furthermore, since it is difficult to fully test an unpackaged device such as a flip chip, it becomes desirable to be able to remove the chip if final testing indicates that the chip is not operating optimally, either through a fault with the chip or as a result of improper mounting. Thermoset underfills do not allow the assembly to be reworked since thermosets cannot be melted once they have crosslinked.

The present invention eliminates the problems associated with thermoset underfills by incorporating a thermoplastic resin as the main component of the underfill. Thus, the chip can be removed by raising the chip temperature to above the melting point of the solder (approximately 183° C. for tin/lead solder) and above the de-bonding temperature of the underfill resin. Typically, the rework temperature must be above the solder reflow temperature, but less than about 220° C. depending on the circuit substrate. An average rework temperature would be about 200° C. The temperature can be higher if localized heat is used; for example, in an alternate embodiment, a chip bonder could be used to remove chips from a substrate post-bonding. In still another embodiment, the underfill may also include a B-staged thermoset that will de-polymerize at an elevated temperature.

Suitable thermoplastic resins include phenoxy, acrylic, methacrylic, polycarbonate, polyamides, polybutene, polyesters and some polyolefins. It is noted that the underfill does not need to be melted, rather, it is only necessary for the underfill to soften for de-bonding. Desirable polymers for use as thermoplastic underfill materials include thermoplastic die attach adhesives available from Alpha Metals under the trade name Staystik. Such materials can be de-bonded cleanly at elevated temperatures. Thus, when such materials are used, the thermoplastic film can be pealed away from both the chip and the circuit at elevated temperatures, leaving no residue.

Alternatively, the underfill can be made from a resin that is known to debond when a specific solvent is applied. One such resin system is a temporary attach adhesive available from Alpha Metals under the trade name Staystik 393. Underfills made with Staystik can be modified to contain a low expansion inorganic filler, preferably, a spherically-shaped silica of about 5 to about 15 microns in diameter. In order to achieve the desired coefficient of thermal expansion (CTE) close to that of tin/lead solder (22.5 ppm/deg. ° C.), the underfill should comprise about 60–70% by weight silica and about 20–30% resin. Note that one advantage of using Staystik 393 is that it does not dissolve, but does debond in the presence of alcohol, thereby providing a system by which any residue can be easily removed.

An underfill made with resins of the type described above would allow the underfill to debond by adding alcohol around the chip site. That not withstanding, however, the solder joints would still have to be heated to solder reflow temperatures to allow the chip to be removed. The present invention recognizes that flux is required only at the areas of the solder bumps, and not in the spaces in between those connecting elements. Thus, the present invention separates the flux from the underfill in the regions between the solder bumps. Furthermore, by maintaining the flux and underfill as separate entities, additives tailored to each individual component may be added to provide both the flux and the underfill with desired properties. For example, the underfill can be a thermoplastic that de-bonds at elevated temperatures, or the flux layer can be designed to de-bond. As an alternative, the flux can convert to a strongly-bonded polymer after its mission as a flux has been accomplished, and the underfill can have the de-bonding properties. As such, a system in which the flux and underfill are maintained as separate entities is extremely versatile.

In one embodiment, the underfill material is preferably a thermoplastic or a thermoset having a very low crosslink density. In either case, the underfill material is filled with a low expansion inorganic particulate material such as silica. The resulting underfill should preferably have a coefficient of thermal expansion (CTE) that approximates that of the solder joint or other joining material. In the case of eutectic solder joints, the CTE should range from approximately twenty to thirty parts per million per ° C. It is preferred that the resin system is soluble in a safe solvent system to allow the resin to be coated as a liquid in a viscosity range suitable for wafer-coating methods. Although a dry polymer film or powder could be coated onto the wafer by melting, a liquid is preferred because of the availability of wafer dispensing and coating equipment adapted to liquid handling processes. Additionally, this embodiment includes a layer of flux that is designed to be compatible with flip-chip assembly and underfills.

One such flux system includes epoxy resins and an organic carboxylic acid, an anhydride or a combination thereof, and is commercially available from Alpha Metals under the trade name ChipFlux 2020. This material is a carboxy acid system. (Anhydrides are used in related products, although the acid derivatives provide stronger flux activity and more consistency). Although this material is a paste made with liquid epoxy resins, the system can be readily modified for use in the present invention. For example, solid epoxy resins having slightly higher molecular weight than liquid epoxies can be substituted and used with carboxylic acid as the flux. Even with solid epoxy resins and carboxylic acid (which is a solid at room temperature), the system can easily be dissolved in polar solvents and can then be coated in a liquid state and dried to a solid film. Although the preferred flux application methods are spin coating, spraying, or stencilling, the wafer can also be coated using a dipping process in which the bump side of the wafer is pressed against a thin layer of flux on a dispensing drum consisting of a rotating platen disk and a doctor blade to control the liquid thickness.

The invention can be further understood with reference to the attached Figures. As can be seen schematically in FIG. 1, a semiconductor device 10 comprises a portion of a semiconductor wafer 12 having an underfill material 14 applied to one surface thereof. The wafer 12 further includes a plurality of connection pads 15 which, ultimately, will contact the solder bumps and provide an electrical connection between the bumps and the underlying wafer circuitry. The underfill material has been applied to the surface upon which the solder bumps will be formed.

Figure 2:
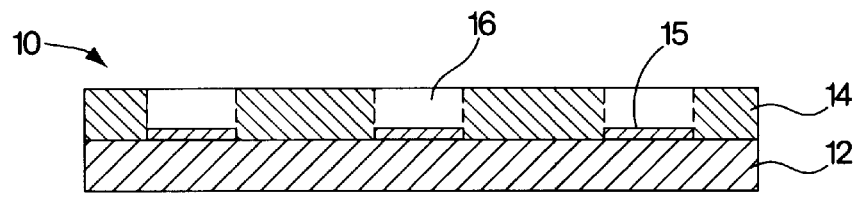
FIG. 2 is a schematic depiction of the device in FIG. 1 in which the underfill material has been treated to form apertures therein, the apertures allowing the underfill to act as a mask during solder bump application.

In FIG. 2, the underfill material 14 has been processes to form a plurality of apertures 16 through its depth. The apertures 16 are positioned precisely at the connection pads 15 on the wafer 12. Thus, as solder material fills the apertures, it will contact the connection pads 15 on the surface of the wafer. By providing the apertures 16 in the underfill material 14, the underfill material 14 is formed into a mask for applying the solder bumps. As such, the need for a separate mask to position the solder bumps is eliminated, because the underfill material serves the masking role as well as the underfilling role.

Figure 3:
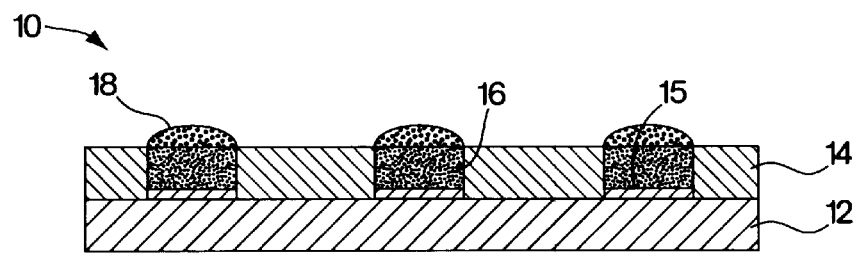
FIG. 3 is a schematic depiction of the device of FIG. 2 following application of solder bumps.

In FIG. 3, the solder bumps have been applied to the device 10. In particular, each of the apertures 16 in the underfill material 14 has been filled by a solder bump 18. The bumps 18 electrically contact the wafer 12 through the connection pads 15, and extend a slight distance above the underfill material 14 as well.

Figure 4:
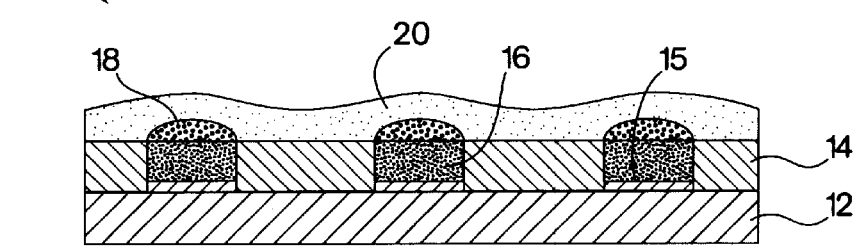
FIG. 4 is a schematic depiction of the device of FIG. 3 showing application of a flux layer over the solder bumps.
Figure 5:
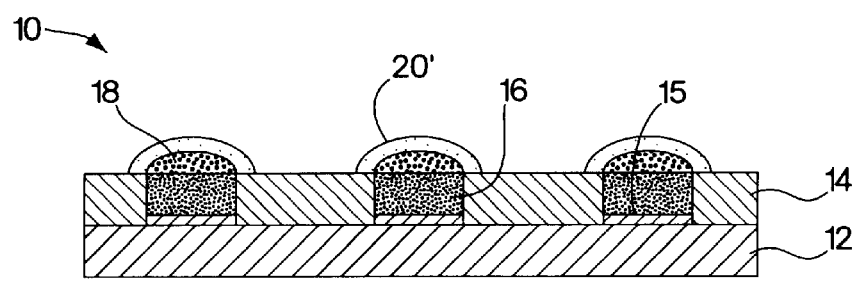
FIG. 5 is a schematic depiction of an alternate embodiment of the device of FIG. 4 showing application of a flux layer over the solder bumps only.

FIG. 4 shows the device 10 after the application of a flux material 20. As can be seen in the Figure, the flux 20 covers the entire exposed, bumped surface of the device 10. An alternative embodiment is shown in FIG. 5. In that Figure, the flux 20' does not cover the entire bumped surface of the device 10, but rather, covers only the portion of the bumps 18 that extends above the underfill material 14. As such, flux 20' will be present only in the precise areas in which it is needed, rather than over the entire exposed, bumped surface of the device 10.

The following Examples will help to illustrate the invention further.

EXAMPLES

Example 1: Thermoplastic Reworkable Underfill Coating Solution 100 grams of Staystik 908 (a 20% solids phenoxy solution) was blended with 30 grams of silica filler (FB-35 from Denka Ltd., Tokyo, Japan) using a high shear type mixer (Cowels Dissolver run at 2500 rpm) for 2 minutes. Entrapped air bubbles were allowed to dissipate prior to using the solution as a coating solution.

The resulting material was spin-coated onto an unbumped wafer mounted on a wafer coating machine (SCS Coater P6204-A). The coating was then dried using the following profile: 50° C. for 20 minutes, 80° C. for 30 minutes, 110° C. for 30 minutes. The resulting fil was found to be smooth and dry.

Subsequently, openings were produced in the dry film layer using laser machining. Eutectic solder bumps were then formed in the openings. This was accomplished by applying solder paste to pad areas on the wafer using stencil printing, and then reflowing the solder to form the bumps. A flux was then applied to the bumps.

Example 2: Flux/Underfill Preparation

40% by weight bisphenol A epoxy resin (Shell, Epon 1007F) and 45% by weight dipropylene glycol methyl ether acetate, were blended together with 5% by weight hydrogenated castor oil. The blend was cooled to 25° C. Following the cooling step, 10% by weight adipic acid was dispersed in the blend using a high speed mixer.

The resulting flux is useful for coating onto solder bumps and the entire exposed, bumped surface of a wafer, including the underfill. Alternatively, the flux can be applied to the bumps only. Once applied, the flux is converted into a solid by drying it at about 60° C. for 30 minutes.

Equivalents

From the foregoing detailed description of the specific embodiments of the invention, it should be apparent that a unique flip chip having an underfill which also acts as a mask for the bump application process has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims.

What is claimed is:

1. A method of making an integrated circuit assembly which comprises the steps of:

a) providing a substrate having at least one solderable contact site on a surface thereof;

b) applying an underfill material to the substrate surface in a manner which substantially entirely covers the substrate surface and the solderable contact site;

c) treating the underfill material to form at least one aperture therein, the at least one aperture extending substantially entirely through the underfill material and being located such that it exposes only the solderable contact site;

d) applying at least one solder bump to the assembly in a manner such that a bump occupies each aperture in the underfill, contacts the exposed solderable contact site therein, and extends above the underfill material; and e) applying a flux to the surface, the flux covering at least the exposed portions of the solder bumps.

2. The method of claim 1 wherein the substrate comprises a semiconductor wafer.

3. The method of claim 2 wherein the substrate comprises a semiconductor chip.

4. The method of claim 3 wherein the substrate comprises a flip chip.

5. The method of claim 1 wherein the flux covers substantially the entire surface upon which the solder bumps are exposed.

6. The method of claim 1 wherein the flux comprises an epoxy resin and a material selected from the group consisting of carboxylic acids, anhydrides and combinations thereof.

7. The method of claim 1 wherein the underfill material is reworkable.

8. The method of claim 7 wherein the underfill material comprises a thermoplastic material.

9. The method of claim 8 wherein the thermoplastic material is selected from the group consisting of phenoxy resins, acrylic resins, methacrylic resins, polycarbonate resins, polyamide resins, polybutene resins, polyester resins, polyolefin resins and mixtures thereof.

10. The method of claim 1 wherein the apertures are formed using photoablation.

11. The method of claim 10 wherein the apertures are formed using a laser.

12. The method of claim 11 wherein the laser is selected from the group consisting of excimer lasers, UV lasers and infrared lasers.

13. The method of claim 11 wherein the apertures are formed using a directed laser beam.

14. The method of claim 11 wherein the apertures are formed using a pattern mask.

15. A method for affixing an integrated circuit chip to a substrate which comprises the steps of:
- a) providing a substrate having a plurality of solderable contact sites on a surface thereof;
- b) providing an integrated circuit chip having a plurality of solderable contact sites on a surface thereof, each solderable contact site on the integrated circuit chip having a corresponding solderable contact site on the surface of the substrate, the integrated circuit chip further characterized in that it was made by a process including the steps of:
   - i) providing a semiconductor wafer having at least one solderable contact site on a surface thereof;
   - ii) applying an underfill material to the wafer surface in a manner which substantially entirely covers the wafer surface and the solderable contact site;
   - iii) treating the underfill material to form at least one aperture therein, the at least one aperture extending substantially entirely through the underfill material and being located such that it exposes only the solderable contact site on the wafer;
   - iv) applying at least one solder bump to the assembly in a manner such that a bump occupies each aperture in the underfill, contacts the exposed solderable contact site therein, and extends above the underfill material;
   - v) applying a flux to the surface, the flux covering at least the exposed portions of the solder bumps; and
   - vi) dividing the wafer into at least one integrated circuit chip;
- c) positioning the integrated circuit chip relative to the substrate such that each solder bump is in contact with a solderable contact site on the substrate;
- d) heating the integrated circuit chip to a temperature sufficiently high to melt the solder and the underfill material; and
- e) allowing the solder and underfill material to solidify.

* * * * *